(12) United States Patent
Go et al.

(10) Patent No.: US 9,989,811 B2
(45) Date of Patent: Jun. 5, 2018

(54) DISPLAY APPARATUS AND METHOD OF MANUFACTURING THE SAME

(71) Applicant: SAMSUNG DISPLAY CO., LTD., Yongin-si, Gyeonggi-do (KR)

(72) Inventors: Jaekyung Go, Yongin-si (KR); Eunjae Na, Yongin-si (KR); Minjun Jo, Yongin-si (KR); Hyunmin Hwang, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days. days.

(21) Appl. No.: 15/273,569

(22) Filed: Sep. 22, 2016

(65) Prior Publication Data
US 2017/0153472 A1 Jun. 1, 2017

(30) Foreign Application Priority Data
Nov. 26, 2015 (KR) .......................... 10-2015-0166409

(51) Int. Cl.
*G02F 1/1339* (2006.01)
*H01L 51/52* (2006.01)
*H01L 27/32* (2006.01)
*G02F 1/1333* (2006.01)

(52) U.S. Cl.
CPC ...... *G02F 1/1339* (2013.01); *G02F 1/133351* (2013.01); *H01L 27/323* (2013.01); *H01L 51/5246* (2013.01); *G02F 2201/503* (2013.01)

(58) Field of Classification Search
None
See application file for complete search history.

(56) References Cited

U.S. PATENT DOCUMENTS

| | | | | |
|---|---|---|---|---|
| 9,530,981 | B2* | 12/2016 | Koo | ................... H01L 51/5246 |
| 2007/0176550 | A1* | 8/2007 | Kwan | ................. H01L 51/5246 313/512 |
| 2011/0057892 | A1* | 3/2011 | Kwak | ................... G06F 3/0412 345/173 |
| 2012/0267660 | A1* | 10/2012 | Han | ...................... H01L 51/524 257/98 |
| 2012/0287026 | A1 | 11/2012 | Masuda | |
| 2014/0063407 | A1 | 3/2014 | Kwon et al. | |
| 2015/0084055 | A1* | 3/2015 | Nagata | ................. H01L 51/524 257/72 |

FOREIGN PATENT DOCUMENTS

| | | |
|---|---|---|
| KR | 10-2011-0025375 | 3/2011 |
| KR | 10-2012-0018978 | 3/2012 |
| KR | 10-2014-0028776 | 3/2014 |
| KR | 10-2014-0035755 | 3/2014 |
| KR | 10-2015-0097853 | 8/2015 |
| WO | WO 2012/011268 A1 | 1/2012 |

\* cited by examiner

*Primary Examiner* — Ashok Patel
(74) *Attorney, Agent, or Firm* — Lewis Roca Rothgerber Christie LLP

(57) ABSTRACT

Provided are a method of manufacturing a display apparatus and the display apparatus. A method of manufacturing a display apparatus includes preparing a first substrate including a display; adhering a second substrate to the first substrate by using a sealing element; exposing the sealing element by using a blocking member including a plurality of blocking patterns arranged apart from one another; and cutting the first substrate and the second substrate along portions thereof inside the blocking member.

20 Claims, 18 Drawing Sheets

DISPLAY APPARATUS AND METHOD OF MANUFACTURING THE SAME

CROSS-REFERENCE TO RELATED APPLICATION

This application claims priority to and the benefit of Korean Patent Application No. 10-2015-0166409, filed on Nov. 26, 2015 in the Korean Intellectual Property Office, the entire content of which is incorporated herein by reference.

BACKGROUND

1. Field

Aspects of one or more embodiments relate to a display apparatus and a method of manufacturing the same.

2. Description of the Related Art

Since display apparatuses including an organic light-emitting display apparatus and a liquid crystal display apparatus may be manufactured as thin display apparatuses and/or flexible display apparatuses, various research into them is being made. Such a display apparatus may have a structure in which a display is between a first substrate and a second substrate as the first substrate having formed thereon the display is adhered to the second substrate by using an encapsulating element.

However, in such a display apparatus in the related art, a first substrate and/or a second substrate may be easily damaged by an external shock.

SUMMARY

According to an aspect of one or more embodiments, a display apparatus has improved shock resistance, and a method of manufacturing the same is provided.

Additional aspects will be set forth in part in the description which follows and, in part, will be apparent from the description, or may be learned by practice of the presented embodiments.

According to one or more embodiments, a method of manufacturing a display apparatus includes preparing a first substrate including a display; adhering a second substrate to the first substrate by using a sealing element; exposing the sealing element by using a blocking member including a plurality of blocking patterns arranged apart from one another; and cutting the first substrate and the second substrate along portions thereof inside the blocking unit.

The blocking member may overlap portions of the sealing element.

The blocking member may overlap outer end portions of the sealing element.

The adhering of the second substrate to the first substrate may include arranging the second substrate on the first substrate; and arranging the blocking member on the second substrate such that the blocking member overlaps a portion of the sealing element.

The plurality of blocking patterns may be sequentially arranged apart from one another in a widthwise direction of the sealing element.

At least a portion of the blocking member may include a first blocking pattern at least partially overlapping the sealing element; and a second blocking pattern arranged apart from the first blocking pattern in a widthwise direction of the sealing element.

A width of the first blocking pattern in the widthwise direction may be equal to or greater than a width of the second blocking pattern in the widthwise direction.

At least one of the plurality of blocking patterns may have a linear shape or a dot-like shape.

The plurality of blocking patterns may be formed of a metal.

The method may further include forming a touch screen conductive pattern on the second substrate, wherein the plurality of blocking patterns may be formed during the forming of the touch screen conductive pattern.

A distance between blocking patterns adjacent to each other from among the plurality of blocking patterns may be within about 7 μm.

The blocking member may overlap three surface portions of the sealing element.

In the exposing of the sealing element, a portion of the sealing element not overlapping the blocking member may be exposed, and a portion of the sealing element overlapping the blocking member may not be exposed.

The width of the exposed portion of the sealing element may be less than or equal to 800 μm.

In the cutting of the first substrate and the second substrate, the first substrate and the second substrate may be cut such that a width of the display apparatus measured with respect to the sealing element is greater than a width of the first substrate or the second substrate.

In the cutting of the first substrate and the second substrate, the first substrate may be cut such that the width of the first substrate increases in a direction from the outer surface of the first substrate toward the inner surface of the first substrate.

In the cutting of the first substrate and the second substrate, the first substrate may be cut such that a first constant portion having a constant width and a first increasing portion having an increasing width are defined.

In the cutting of the first substrate and the second substrate, the first constant portion may be cut by using a cutting wheel.

The first increasing portion may be naturally cut due to the internal stress of the first substrate.

BRIEF DESCRIPTION OF THE DRAWINGS

These and/or other aspects will become apparent and more readily appreciated from the following description of some embodiments, taken in conjunction with the accompanying drawings in which.

DETAILED DESCRIPTION

Figure 1:
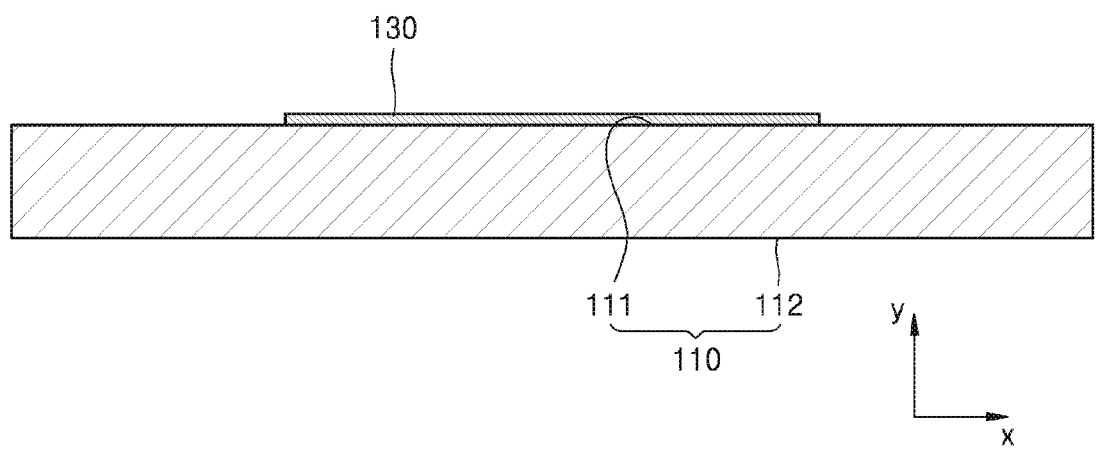
FIGS. 1 through 8 are schematic diagrams showing operations of a method of manufacturing a display apparatus, according to an embodiment.

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are described below, by referring to the figures, merely to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, the inventive concept will be described in further detail by explaining some example embodiments of the invention with reference to the attached drawings.

It will be understood that when a layer, region, or component is referred to as being "formed on" another layer, region, or component, it can be directly or indirectly formed on the other layer, region, or component. That is, for example, intervening layers, regions, or components may be present. Sizes of elements in the drawings may be exaggerated for convenience of explanation. In other words, since sizes and thicknesses of components in the drawings may be arbitrarily illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIGS. 1 through 8 are schematic diagrams showing operations of a method of manufacturing a display apparatus, according to an embodiment.

According to a method of manufacturing a display apparatus, a first substrate 110 is prepared. The first substrate 110 (e.g., a glass substrate) includes a first inner surface 111 and a first outer surface 112, as shown in FIG. 1, where the first outer surface 112 may be understood as a surface that becomes an outer surface after the first substrate 110 is adhered to a second substrate 120 later. Side surfaces of the first substrate 110 may be understood as surfaces interconnecting the first inner surface 111 and the first outer surface 112 together.

After the first substrate 110 is prepared as described above, a display 130 including a display element is formed on the first inner surface 111 of the first substrate 110, as shown in FIG. 1. The display element may be an organic light-emitting display element, a liquid crystal display element, or one of various other display elements. Furthermore, various other modifications may be made thereto. For example, the display 130 may further include electronic elements, such as a thin-film transistor and/or a capacitor, other than display elements.

Other than the first substrate 110, a second substrate 120 (e.g., a glass substrate) (see FIG. 2A and FIG. 2B) is also prepared. The second substrate 120 includes a second inner surface 121 and a second outer surface 122. The first substrate 110 and the second substrate 120 may be prepared concurrently (e.g., simultaneously). Alternatively, either the first substrate 110 or the second substrate 120 may be prepared first, and then the other one may be prepared. However, the inventive concept is not limited thereto.

Figure 2A:
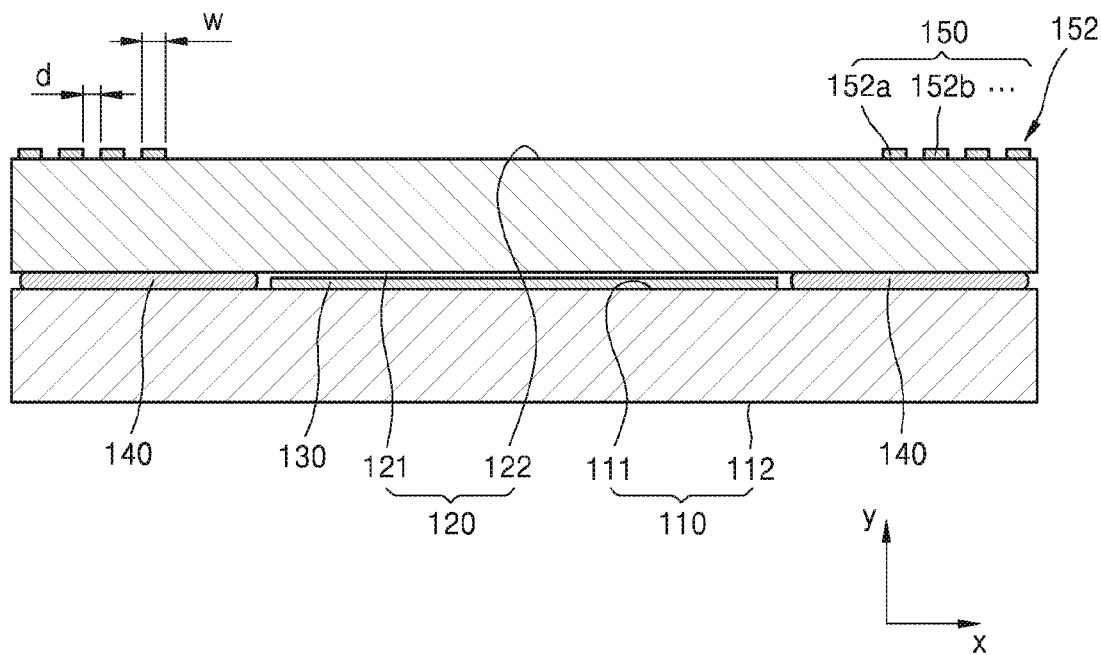

As shown in FIG. 2A, the first substrate 110 is adhered to the second substrate 120 by using a sealing element 140. The sealing element 140 may be arranged between the first inner surface 111 of the first substrate 110 and the second inner surface 121 of the second substrate 120 and may surround the display 130, thereby adhering the first substrate 110 and the second substrate 120 to one another. In an embodiment, the sealing element 140 may have a width from about 200 μm to about 800 μm and a thickness from about 2 μm to about 10 μm.

The sealing element 140 may include frit, for example. Frit is glass material used to form glass and may be cured after exposure to a laser beam. The main components of the frit may include 15-40 wt % $V_2O_5$, 10-30 wt % $TeO_2$, 1-15 wt % $P_2O_5$, 1-15 wt % BaO, 1-20 wt % ZnO, 5-30 wt % $ZrO_2$, 5-20 wt % $WO_3$, and 1-15 wt % BaO, where at least one or more of $Fe_2O_3$, CuO, MnO, $Al_2O_3$, $Na_2O$, and $Nb_2O_5$ may be added thereto. The frit having the above-stated composition may have a thermal expansion coefficient of $40\sim100\times10^{-7}/°$ C. and a glass transition temperature from about 250° C. to about 400° C. If the frit as described above is used, after the frit is cured later, a cured portion may induce internal stress distribution in the first substrate 110 and the second substrate 120 as described below, and, thus, when the first substrate 110 and the second substrate 120 are cut, cut surfaces may become curved surfaces. Further detailed descriptions thereof are provided below.

The first substrate 110 may be adhered to the second substrate 120 by using the sealing element 140 in any of various ways. In an embodiment, for example, after the sealing element 140 is arranged along the edges of the second inner surface 121 of the second substrate 120, the first substrate 110 may be adhered to the second substrate 120. In another embodiment, after the sealing element 140 is arranged along the edges of the first inner surface 111 of the first substrate 110 and completely surrounds the display 130, the first substrate 110 may be adhered to the second substrate 120. In any case, as the first substrate 110 is adhered to the second substrate 120, the sealing element 140 ends up with curved side surfaces as shown in FIG. 2A. FIG. 2A shows that the side surfaces of the sealing element 140 are curved outward.

Figure 2B:
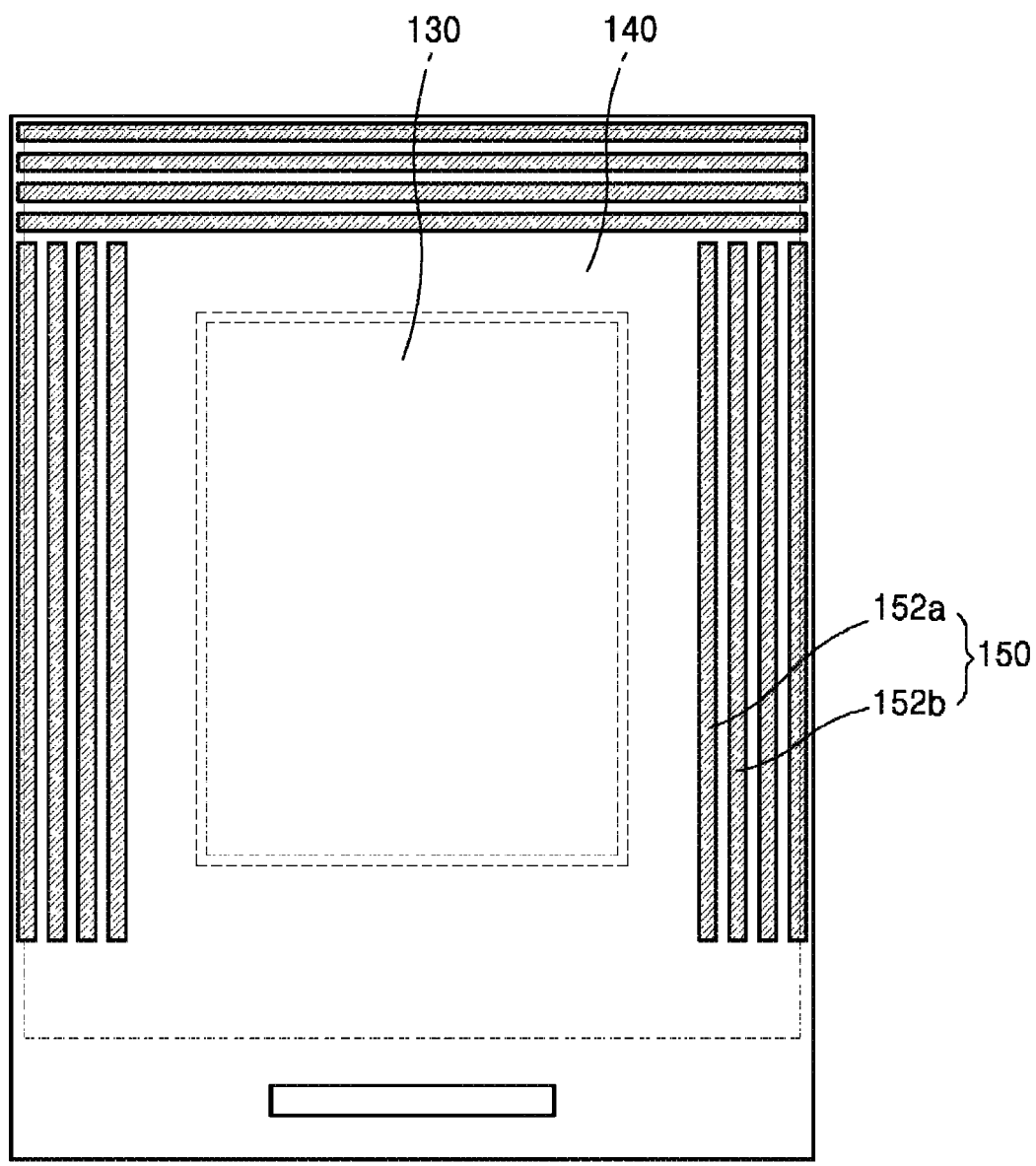

As shown in FIGS. 2A and 2B, a blocking unit or blocking member 150 may be formed on the second outer surface 122 of the second substrate 120. As described below, the blocking unit 150 may block transmission of a laser beam to prevent a portion of the sealing element 140 from being exposed while the sealing element 140 is being exposed. To this end, the blocking unit 150 may overlap a portion of the sealing element 140. For example, the blocking unit 150 may overlap an outer end portion of the sealing element 140. As shown in FIG. 2B, the blocking unit 150 may overlap three surface portions of the sealing element 140.

In an embodiment, the blocking unit 150 may reflect an incident laser beam to block transmission of the laser beam. However, a reflected laser beam may damage equipment like a laser source. Therefore, it is desired to reduce reflection of a laser beam and not expose the sealing element 140. To this end, the blocking unit 150 according to an embodiment may include a plurality of blocking patterns 152 arranged apart from one another. In an embodiment, a distance "d" between every two blocking patterns 152 adjacent to each other among the plurality of blocking patterns 152 may be within about 7 μm. Since the distance "d" between the blocking patterns 152 is within about 7 μm, even if a laser beam is incident via a space between the blocking patterns 152, the sealing element 140 may not be exposed.

In an embodiment, the plurality of blocking patterns 152 may be sequentially arranged apart from one another in a widthwise direction of the sealing element 140 (e.g., an x-axis direction). For example, the blocking unit 150 may include a first blocking pattern 152*a*, which at least partially overlaps the sealing element 140, and a second blocking pattern 152*b*, which is arranged apart from the first blocking pattern 152*a* in the widthwise direction of the sealing element 140 (e.g., the x-axis direction). The first blocking pattern 152*a* and the second blocking pattern 152*b* may be arranged next to each other in a lengthwise direction of the sealing element 140. The first blocking pattern 152*a* and the second blocking pattern 152*b* may have linear shapes. However, the inventive concept is not limited thereto.

In an embodiment, the first blocking pattern 152*a* and the second blocking pattern 152*b* may have a same width "w." However, the inventive concept is not limited thereto. Furthermore, the blocking pattern 152 may be formed of a metal capable of reflecting a laser beam.

The blocking unit 150 as described above is formed on the second outer surface 122 of the second substrate 120, and the second substrate 120 including the blocking unit 150 thereon may be adhered to the first substrate 110. Alternatively, after the second substrate 120 is adhered to the first substrate 110, the blocking unit 150 may be formed on the second substrate 120 and overlaps a portion of the sealing element 140.

Figure 3:
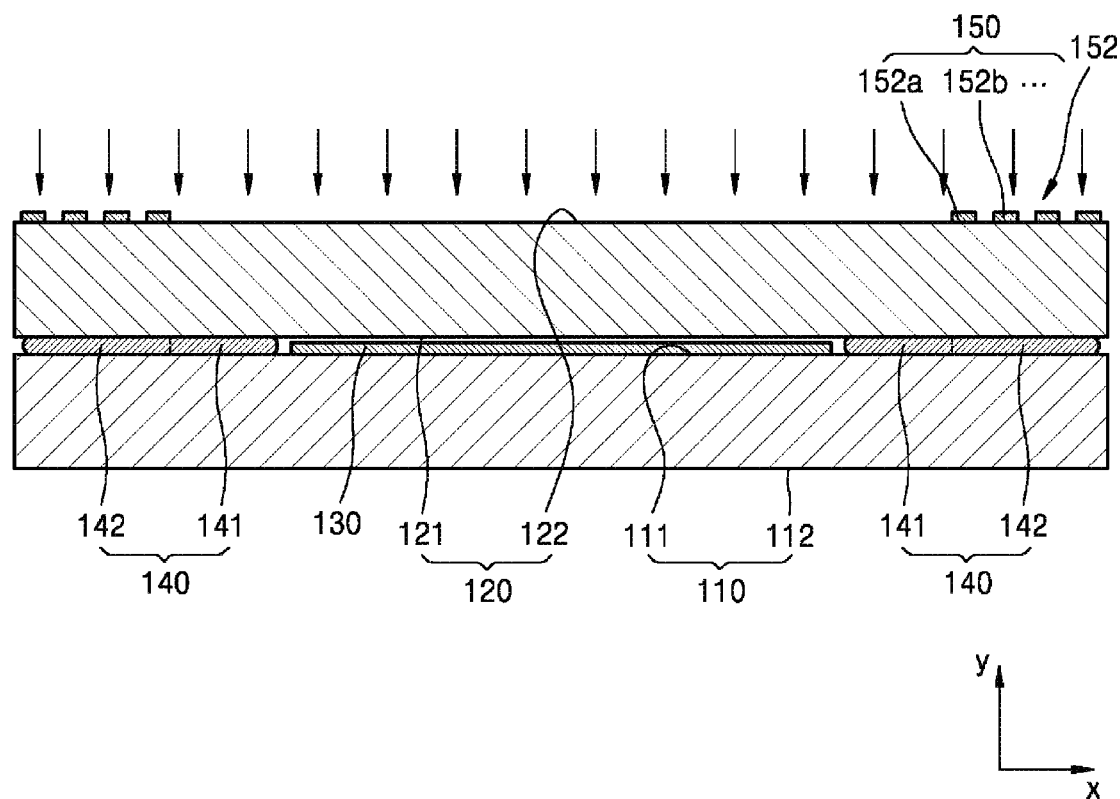

Next, as shown in FIG. 3, the sealing element 140 may be exposed. In an embodiment, only inner portions of the sealing element 140 may be exposed by a laser beam. The output power of the laser beam may be from about 50 Watts to about 60 Watts and a uniformity thereof may be from about 110% to about 95%.

Even if a laser beam is irradiated to the sealing element 140, a laser beam incident to the blocking unit 150 is reflected, and thus a portion 142 (hereinafter, referred to as the unexposed portion) of the sealing element 140 which overlaps the blocking unit 150 may not be exposed. Therefore, only a portion 141 (hereinafter, referred to as the exposed portion) of the sealing element 140 which does not overlap the blocking unit 150 may be exposed.

Figure 4:
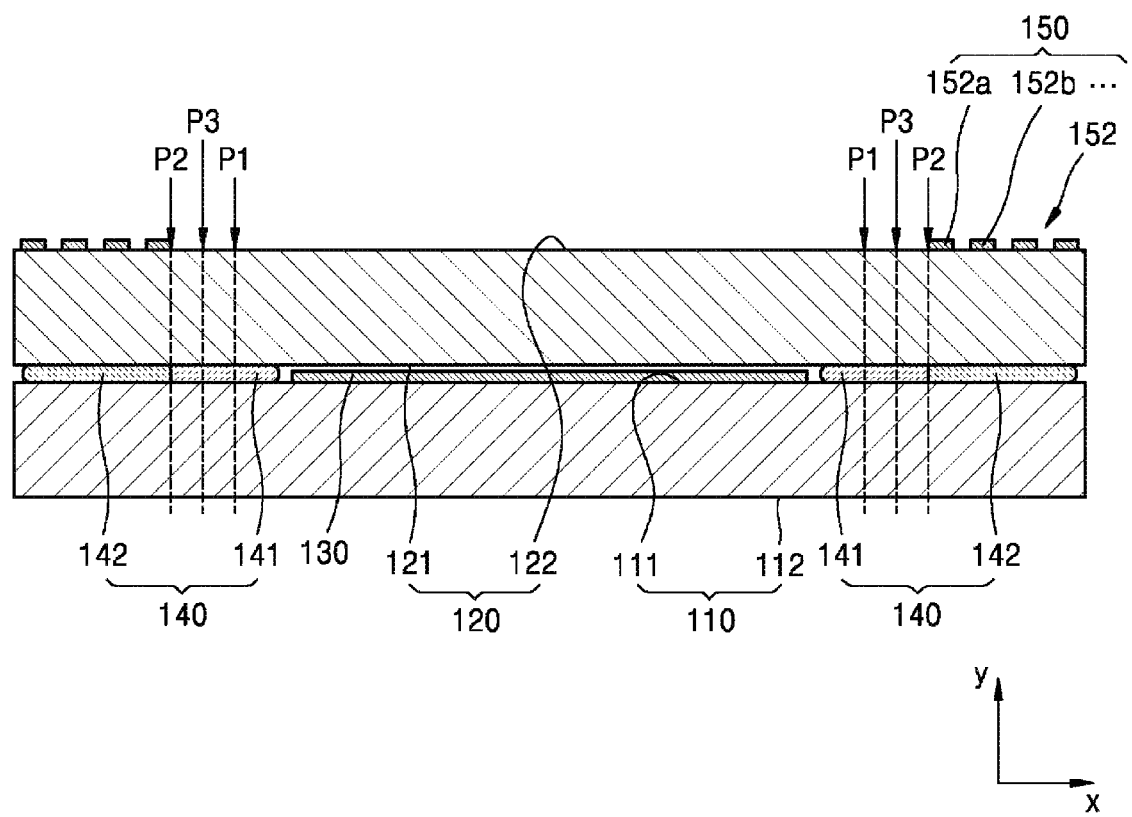
Figure 5:
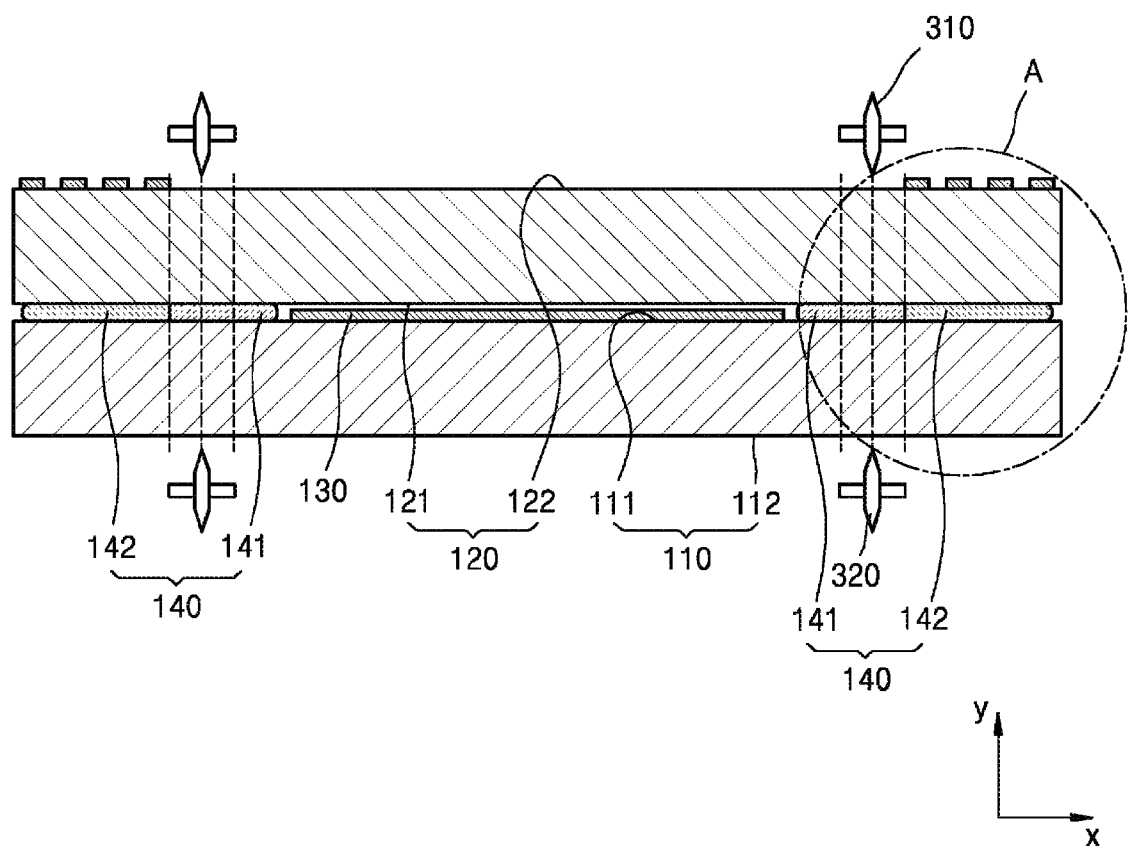

Next, as shown in FIGS. 4 and 5, the first substrate 110, the sealing element 140, and the second substrate 120 may be cut. In an embodiment, for example, a cutting operation may start at points of the first substrate 110 and the second substrate 120 that are closer to the display 130 than the boundary (P2, refer to FIG. 4) between the exposed portion 141 and the unexposed portion 142 of the sealing element 140, e.g., points of the first outer surface 112 and the second outer surface 122 corresponding to a point P1 or P3 of the sealing element 140.

The cutting start point will be described below in further detail. The center of the exposed portion 141 of the sealing element 140 may be referred to as a first point P1, the boundary between the exposed portion 141 and the unexposed portion 142 of the sealing element 140 may be referred to as a second point P2, and the center of the portion between the first point P1 and the second point P2 may be referred to as a third point P3. Here, the cutting start point may be points of the first substrate 110 and the second substrate 120 corresponding to the third point P3 or points of the first substrate 110 and the second substrate 120 corresponding to a point between the second point P2 and the third point P3. FIG. 5 shows an example in which a cutting operation starts at points of the first substrate 110 and the second substrate 120 corresponding to the third point P3 by using at least one of cutting wheels 310 and 320.

Figure 6:
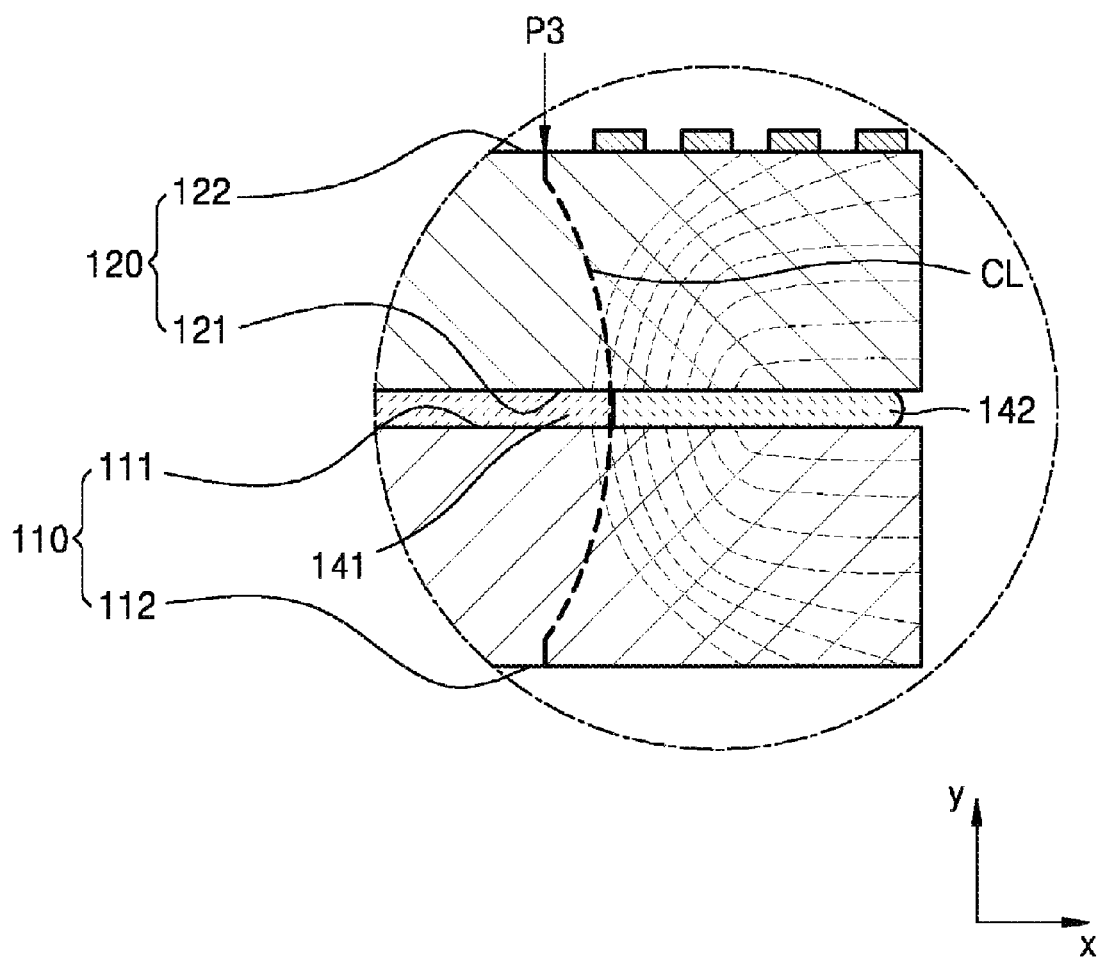

FIG. 6 is a sectional diagram showing a region "A" of FIG. 5 in closer detail, showing internal stress in the first substrate 110 and the second substrate 120 induced by the sealing element 140. In FIG. 6, the thin dashed lines indicate internal stress, whereas the thick dashed line indicates a cutting line CL. As described above with reference to FIG. 3, when only the inner portion 141 of the sealing element 140 is exposed, after the sealing element 140 is plasticized, the exposed portion 141 applies stress to the first substrate 110 and the second substrate 120. On the other hand, the unexposed portion 142 only contacts the first substrate 110 and the second substrate 120 and does not apply stress to the first substrate 110 and the second substrate 120. That is, although the exposed portion 141 applies stress as the volume of the exposed portion 141 is reduced while being exposed and plasticized, the unexposed portion 142 does not undergo such a change. Therefore, the internal stress is distributed in the first substrate 110 and the second substrate 120 as indicated by the thin dashed lines in FIG. 6

At such a state, as shown in FIG. 5, a cutting operation may start on at least one of the second outer surface 122 and the first outer surface 112 at points of the first substrate 110 and the second substrate 120 corresponding to the third point P3 of the sealing element 140, for example, by using at least one of the cutting wheels 310 and 320.

Figure 7:
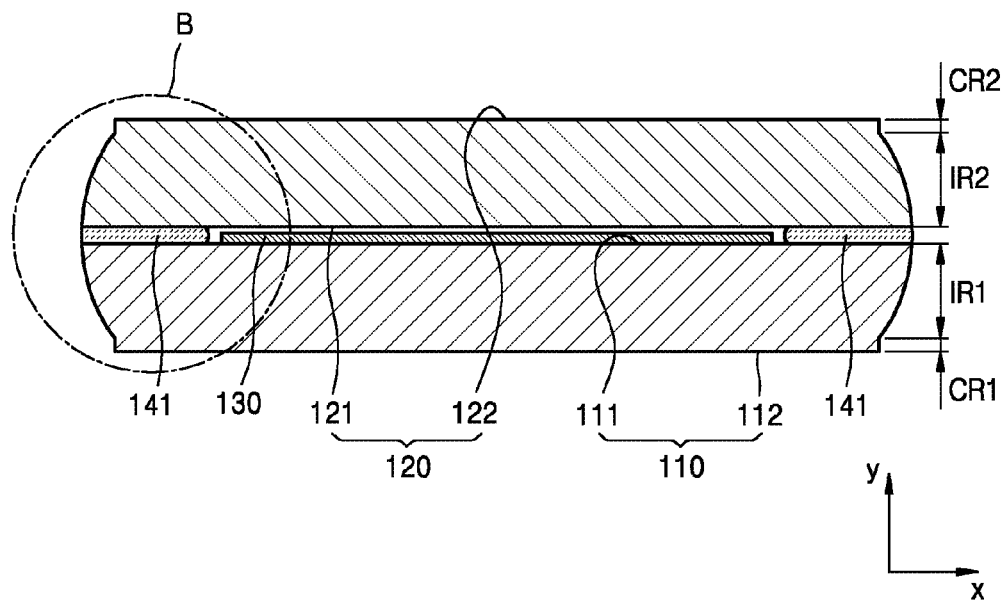

Here, due to the internal stress of the first substrate 110 and the second substrate 120, the first substrate 110 and the second substrate 120 may be naturally cut along the cutting line CL of FIG. 6 to have curved side surfaces, and thus a display apparatus, as shown in FIG. 7, may be manufactured. Cut shapes of the first substrate 110 and the second substrate 120 will be described below in further detail with reference to FIG. 8, which is an enlarged partial sectional diagram showing a region "B" of FIG. 7 in closer detail. When the first substrate 110 and the second substrate 120 are cut, the first substrate 110 and the second substrate 120 may be cut to have a pre-set side surface shape.

In an embodiment, the first substrate 110 may be cut, such that a portion of the first substrate 110 corresponding to the display 130 includes a first constant portion CR1 having a width constant in a direction from the first outer surface 112 to the first inner surface 111 (e.g., a positive y-axis direction), and a first increasing portion IR1 having a width increasing in the same direction. Here, in the case shown in FIGS. 7 and 8, the term "width" may be understood as a length in an x-axis direction. Furthermore, a portion corresponding to the display 130 is not limited to a portion directly above the display 130, but may also include a portion corresponding to the sealing element 140 (141 in FIGS. 7 and 8). As the first substrate 110 is cut as described above, side surfaces of the first substrate 110 may have a first constant side surface 110*b*, which is adjacent to the first outer surface 112 and is substantially perpendicular to the first outer surface 112, and a first increasing side surface 110*a*, which is curved outward in a direction (e.g., the positive y-axis direction) from the first constant side surface 110*b* to the first inner surface 111 of the first substrate 110. Here, the first constant side surface 110*b* refers to a side surface of the first constant portion CR1 of the first substrate 110, and the first increasing side surface 110*a* refers to a side surface of the first increasing portion IR1 of the first substrate 110.

Furthermore, the second substrate 120 may be cut, such that a portion of the second substrate 120 corresponding to the display 130 includes a second constant portion CR2 having a width constant in a direction from the second outer surface 122 to the second inner surface 121 (e.g., a negative y-axis direction), and a second increasing portion IR2 having a width increasing in the same direction. Here, in the cases shown in FIGS. 7 and 8, the term "width" may be understood as a length in an x-axis direction. Furthermore, a portion corresponding to the display 130 is not limited to a portion directly above the display 130, but may also include a portion corresponding to the sealing element 140 (141 in FIGS. 7 and 8). As the second substrate 120 is cut as described above, side surfaces of the second substrate 120 may have a second constant side surface 120b, which is adjacent to the second outer surface 122 and is substantially perpendicular to the second outer surface 122, and a second increasing side surface 120a, which is curved outward in a direction (e.g., the negative y-axis direction) from the second constant side surface 120b to the second inner surface 121 of the second substrate 120. Here, the second constant side surface 120b refers to a side surface of the second constant portion CR2 of the second substrate 120, and the second increasing side surface 120a refers to a side surface of the second increasing portion IR2 of the second substrate 120.

Figure 8:
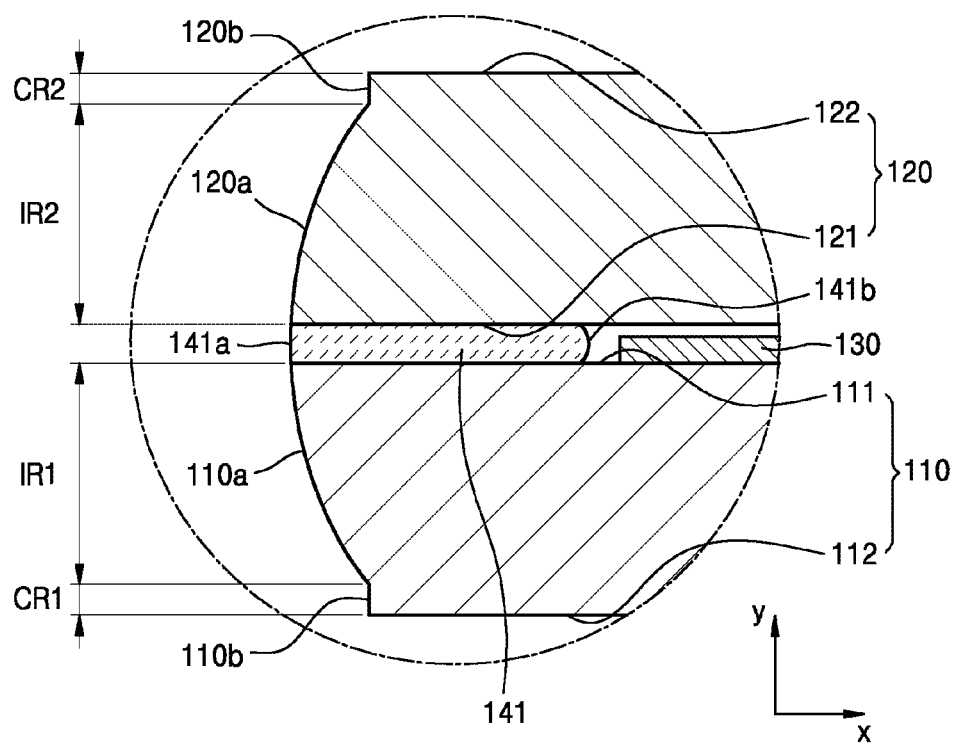

Therefore, in an embodiment, the side surfaces of the first substrate 110 and the second substrate 120 are curved as shown in FIGS. 7 and 8. The cutting line CL may extend along the boundary between the exposed portion 141 and the unexposed portion 142 of the sealing element 140 as shown in FIG. 6. This is because the exposed portion 141 adheres the first substrate 110 to the second substrate 120, but the unexposed portion 142 only contacts the first substrate 110 and the second substrate 120 and does not adhere the first substrate 110 to the second substrate 120.

If a further cutting operation is not naturally performed even after the first constant side surface 110b (refer to FIG. 8) and the second constant side surface 120b (refer to FIG. 8) are formed at the first substrate 110 and the second substrate 120, the first substrate 110 and the second substrate 120 may be naturally cut along the cutting line CL, as shown in FIG. 6, to have curved side surfaces by applying a small amount of force or shock to the first substrate 110 and/or the second substrate 120. Here, it may be understood that the remaining portions of the cutting line CL, other than portions substantially perpendicular to the first outer surface 112 of the first substrate 110 and the second outer surface 122 of the second substrate 120, are substantially perpendicular to the lines (i.e. the thin dashed lines of FIG. 6) indicating the internal stress in the first substrate 110 and the second substrate 120.

In the case of forming the first constant side surface 110b (refer to FIG. 8) and the second constant side surface 120b (refer to FIG. 8) at the first substrate 110 and the second substrate 120, cutting wheels 310 and 320 may be arranged respectively on the second outer surface 122 of the second substrate 120 and the first outer surface 112 of the first substrate 110, as shown in FIG. 5, and the first substrate 110 and the second substrate 120 may be concurrently (e.g., simultaneously) cut inwardly.

As described above, the first substrate 110 and the second substrate 120 may be naturally cut along the remaining portions of the cutting line CL of FIG. 6 other than the portions substantially perpendicular to the first outer surface 112 of the first substrate 110 and the second outer surface 122 of the second substrate 120 due to the internal stress of the first substrate 110 and the second substrate 120. In an embodiment, if only the first constant side surface 110b (refer to FIG. 8) of the first substrate 110 is formed first, and the second constant side surface 120b (refer to FIG. 8) of the second substrate 120 is formed later, the first substrate 110 and the second substrate 120 may be cut due to the internal stress as soon as the first constant side surface 110b (refer to FIG. 8) of the first substrate 110 is formed. In this case, the second constant side surface 120b (refer to FIG. 8) of the second substrate 120 that is substantially perpendicular to the second outer surface 122 of the second substrate 120 may not be normally formed.

Therefore, the cutting wheels 310 and 320 may be arranged respectively on the second outer surface 122 of the second substrate 120 and the first outer surface 112 of the first substrate 110, and the first substrate 110 and the second substrate 120 may be concurrently (e.g., simultaneously) cut inwardly. As a result, the first constant side surface 110b (refer to FIG. 8) and the second constant side surface 120b (refer to FIG. 8) may be respectively formed at the first substrate 110 and the second substrate 120.

In an embodiment, in a display apparatus manufactured as described above, a curvature radius of an inner side surface 141b of the sealing element 140 may be less than a curvature radius of an outer side surface 141a of the sealing element 140, as shown in FIG. 8.

As the sealing element 140 is arranged and the first substrate 110 is adhered to the second substrate 120 as described above, the sealing element 140 has curved side surfaces, as shown in FIG. 2. Therefore, the inner side surface 141b of the sealing element 140 shown in FIG. 8 maintains such a curved shape.

Meanwhile, as shown in FIGS. 5 and 6, when the first substrate 110 and the second substrate 120 are cut after the sealing element 140 is exposed, while the first substrate 110 and the second substrate 120 are being cut along the cutting line CL, the sealing element 140 is cut at a point near the boundary between the exposed portion 141 and the unexposed portion 142. Here, as shown in FIG. 8, the first increasing side surface 110a, which is a side surface of the first increasing portion IR1 of the first substrate 110, the outer side surface 141a of the sealing element 140, and the second increasing side surface 120a, which is a side surface of the second increasing portion IR2 of the second substrate 120, form a continuous curved surface. Here, the outer side surface 141a of the sealing element 140 is arranged near the vertex of the curved surface, and thus the curvature radius of the outer side surface 141a of the sealing element 140 becomes greater than the curvature radius of the inner side surface 141b of the sealing element 140 facing the display 130. Side surfaces of a display apparatus manufactured according to the method according to the present embodiment have a curved shape overall, as shown in FIGS. 7 and 8. When side surfaces of a display apparatus have a curved shape, the first substrate 110 and the second substrate 120 may be significantly less likely to be damaged by an external shock, as compared to a case in which a display apparatus has flat side surfaces perpendicular to the first outer surface 112 of the first substrate 110 or the second outer surface 122 of the second substrate 120. It may be understood that, since the curved side surfaces function like an arch structure, shock resistance, and more particularly, lateral shock resistance, is improved. Therefore, a display apparatus with excellent shock resistance may be embodied.

To this end, the first increasing portion IR1 may be greater than the first constant portion CR1 in the thickness of the first substrate 110 (e.g., in the positive y-axis direction). For example, the first constant portion CR1 may be less than or equal to half of the first increasing portion IR1 in the thickness of the first substrate 110 (e.g., in the positive y-axis direction). In the same regard, the second constant portion CR2 may be less than or equal to half of the second increasing portion IR2 in the thickness of the second substrate 120 (e.g., in the positive y-axis direction).

In a display apparatus manufactured according to the method of the present embodiment, as shown in FIGS. 7 and 8, the first substrate 110 includes the first constant portion CR1, which is a portion of the first substrate 110 corresponding to the display 130 and having a constant width in a direction (e.g., the positive y-axis direction) from the first outer surface 112 toward the first inner surface 111. Therefore, at the first constant portion CR1, the first outer surface 112 and the first constant side surface 110b of the first substrate 110 meet each other substantially perpendicularly, and the boundary between the first outer surface 112 and the first constant side surface 110b of the first substrate 110 becomes clear. As a result, the first outer surface 112 of the first substrate 110 is clearly defined, and, thus, in the case of attaching a functional film, such as an anti-reflection film, a temporary protection film, or a polarizing film, onto the first outer surface 112 of the first substrate 110, it may be easy to attach the functional film to cover the entire first outer surface 112 and not to cover side surfaces of the first substrate 110, that is, the first constant side surface 110b of the first substrate 110.

In an embodiment, the same above-described aspect applies to the second substrate 120. In a display apparatus manufactured according to the method of the present embodiment, as shown in FIGS. 7 and 8, the second substrate 120 includes the second constant portion CR2, which is a portion of the second substrate 120 corresponding to the display 130 and having a constant width in a direction (e.g., the negative y-axis direction) from the second outer surface 122 toward the second inner surface 121. Therefore, at the second constant portion CR2, the second outer surface 122 and the second constant side surface 120b of the second substrate 120 meet each other substantially perpendicularly, and the boundary between the second outer surface 122 and the second constant side surface 120b of the second substrate 120 becomes clear. As a result, the second outer surface 122 of the second substrate 120 is clearly defined, and, thus, in the case of attaching a functional film, such as an anti-reflection film, a temporary protection film, or a polarizing film, onto the second outer surface 122 of the second substrate 120, it may be easy to attach the functional film to cover the entire second outer surface 122 and not to cover side surfaces of the second substrate 120, that is, the second constant side surface 120b of the second substrate 120.

Figure 9:
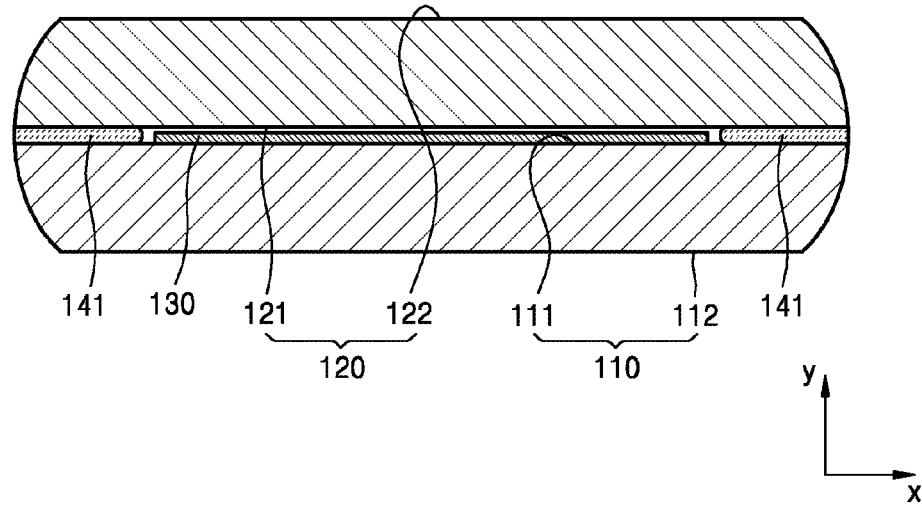
FIG. 9 is a sectional view of a display apparatus according to another embodiment.

FIG. 9 is a sectional view of a display apparatus according to another embodiment. As shown in FIG. 9, the first substrate 110 and the second substrate 120 may include only increasing side surfaces without or with little constant portions. Therefore, side surfaces of the display apparatus may form curved surfaces. To form the increasing side surfaces, outer surfaces of the first substrate 110 and the second substrate 120 may be slightly cut by using a cutting wheel. Furthermore, by applying a small amount of force or shock to the first substrate 110 and the second substrate 120, the first substrate 110 and the second substrate 120 may be naturally cut to have convex side surfaces due to internal stress thereof.

In an embodiment, in case of manufacturing a display apparatus, it may be considered to manufacture a display apparatus having a touch screen function. To embody a touch screen function, a touch screen conductive pattern is formed on the second outer surface 122 of the second substrate 120. Here, the blocking unit 150 may be concurrently (e.g., simultaneously) formed during formation of the touch screen conductive pattern, and, thus, the blocking unit 150 may be formed without performing an additional operation.

Figure 10:
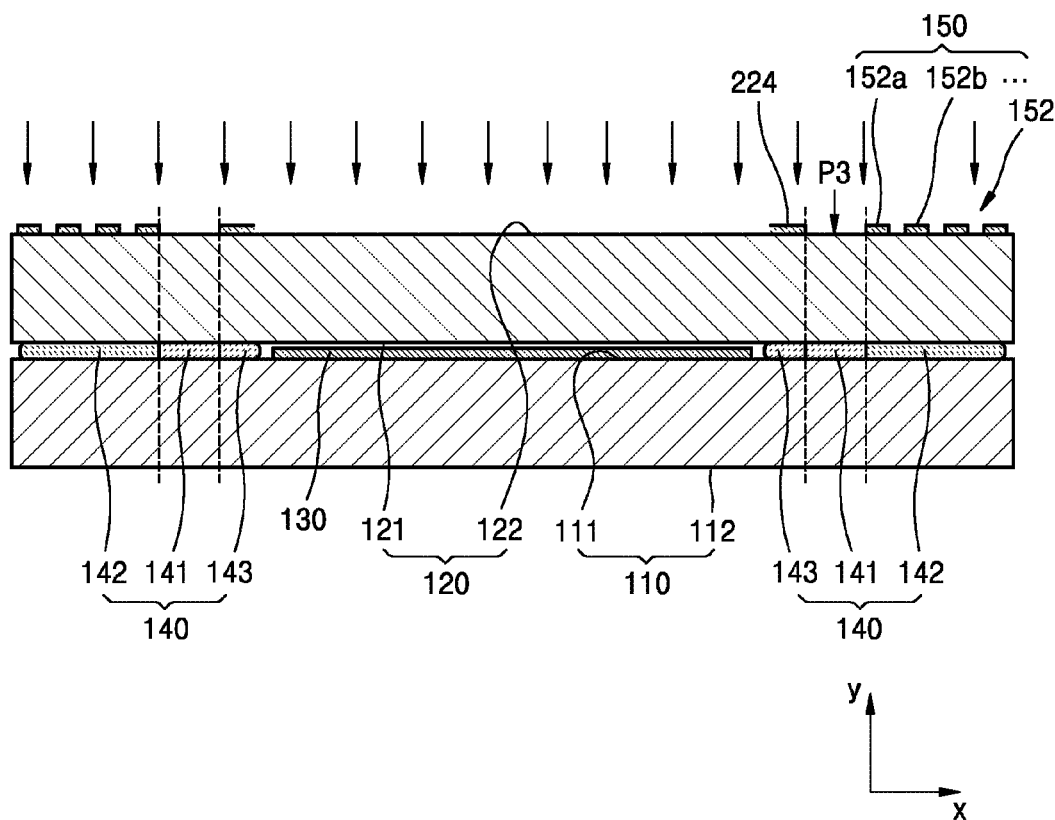
FIG. 10 is a schematic sectional diagram showing an operation of a method of manufacturing a touch screen display apparatus according to an embodiment.

FIG. 10 is a schematic sectional diagram showing an operation of a method of manufacturing a touch screen display apparatus according to an embodiment. In FIG. 10, a touch screen conductive pattern 224 is only partially shown for convenience of explanation. Of course, the blocking unit 150 may be removed from the display apparatus when the first substrate 110 and the second substrate 120 are cut later. A touch screen conductive pattern and/or the blocking unit 150 may be formed on the second outer surface 122 of the second substrate 120 before the second substrate 120 is adhered to the first substrate 110.

As shown in FIG. 10, if the touch screen conductive pattern 224 is on the second outer surface 122 of the second substrate 120, other than the blocking unit 150, the touch screen conductive pattern 224 may also block a laser beam like the blocking unit 150. Therefore, only the portion 141 of the sealing element 140, but not the edge portion 142 and another edge portion 143, may be exposed to a laser beam.

Figure 11:
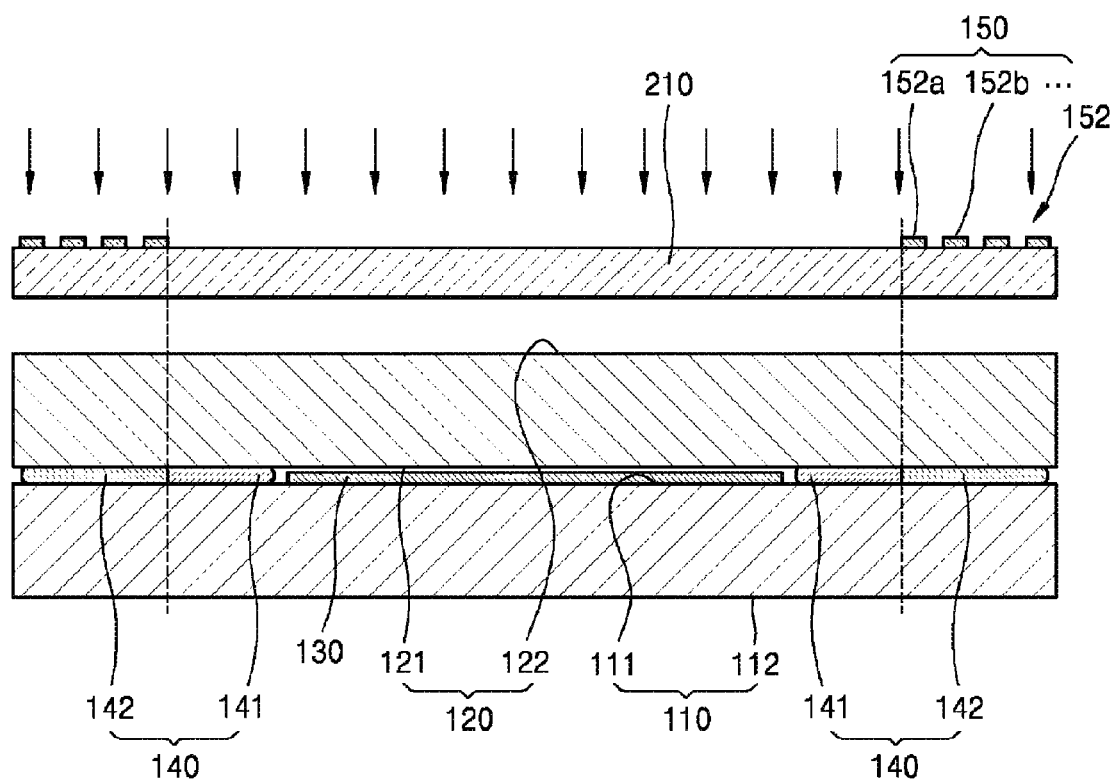
FIG. 11 is a schematic sectional diagram showing an operation of a method of manufacturing a display apparatus according to another embodiment.
Figure 11:
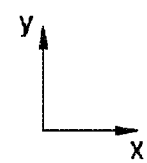

FIG. 11 is a schematic sectional diagram showing an operation of a method of manufacturing a display apparatus according to another embodiment.

As shown in FIG. 11, a display apparatus may be manufactured by using a phototransmissive plate 210 including the blocking unit 150. In FIG. 3, the blocking unit 150 is formed on the second substrate 120. However, the inventive concept is not limited thereto. As shown in FIG. 11, the phototransmissive plate 210 may be arranged, such that the blocking units 150 overlap edge portions of the sealing element 140. Next, a laser beam may be irradiated to the sealing element 140. The first portion 141 of the sealing element 140 may be exposed, whereas the second portion 142 of the sealing element 140 may not be exposed.

As described above, by using the blocking unit 150 including the plurality of blocking patterns 152, transmission and reflection of a laser beam may be suitably controlled. Therefore, the sealing element 140 may be prevented from being exposed, and degradation of equipment, such as a laser source, may be reduced. The blocking unit 150 may have any of various shapes.

Figure 12A:
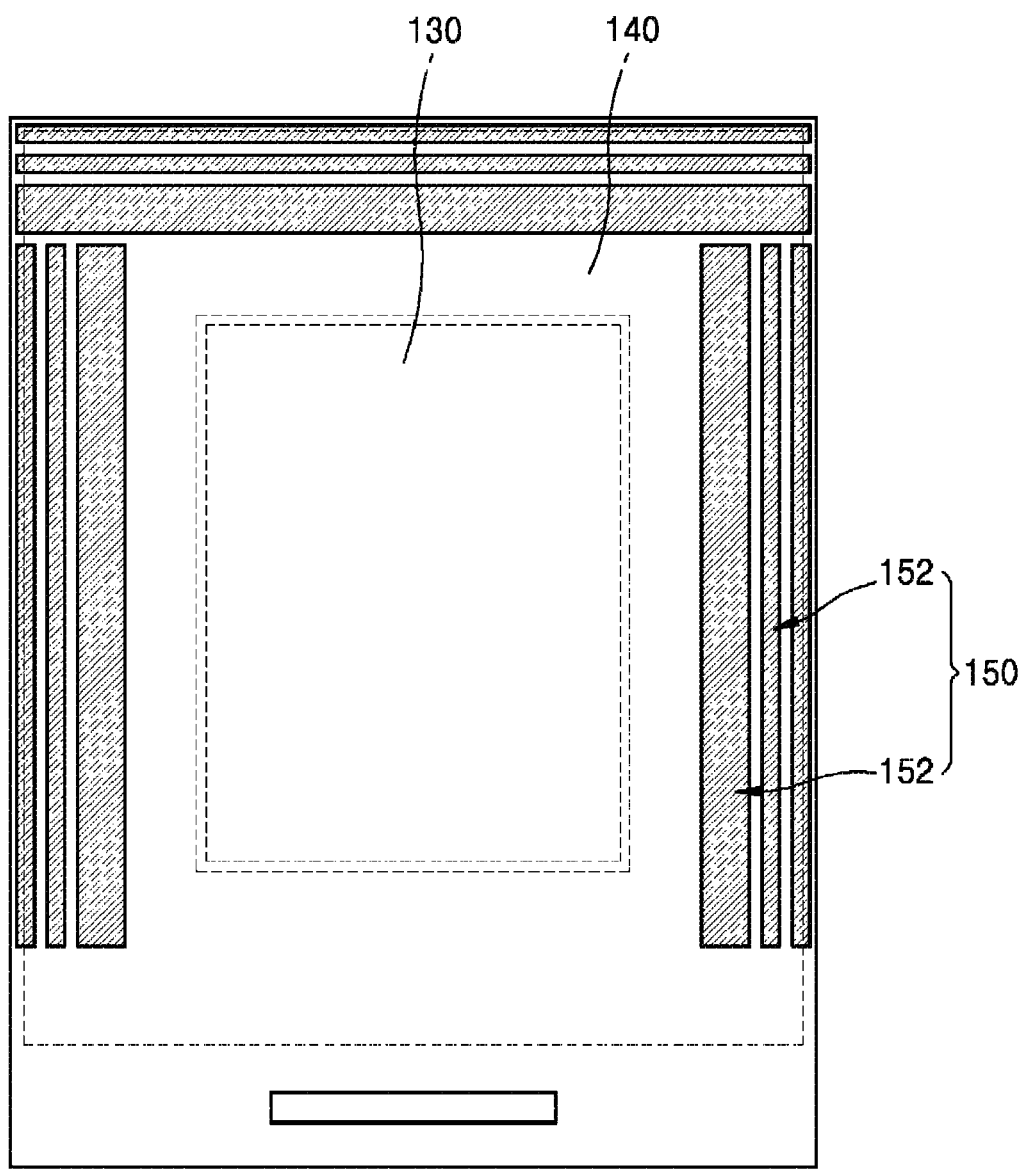
FIGS. 12A through 12G are schematic diagrams showing various examples of a blocking unit according to further embodiments.

FIGS. 12A through 12G are schematic diagrams showing various examples of the blocking unit 150 according to further embodiments. The blocking unit 150 shown in FIG. 2B consists of a plurality of linear blocking patterns 152. Furthermore, the plurality of blocking patterns 152 may have a same width. However, the inventive concept is not limited thereto. In an embodiment, as shown in FIG. 12A, among the plurality of blocking patterns 152, the width of the blocking pattern 152 arranged close to the display 130 may be greater than the width of the blocking pattern 152 arranged farther from the display 130. In an embodiment, the farther the blocking pattern 152 is arranged from the display 130, the smaller the width of the blocking patterns 152 may become. However, the inventive concept is not limited thereto. In another embodiment, for example, the closer the blocking pattern 152 is arranged to the display 130, the smaller the width of the blocking patterns 152 may become. In another embodiment, the blocking patterns 152 may have irregular widths different from one another.

Figure 12B:
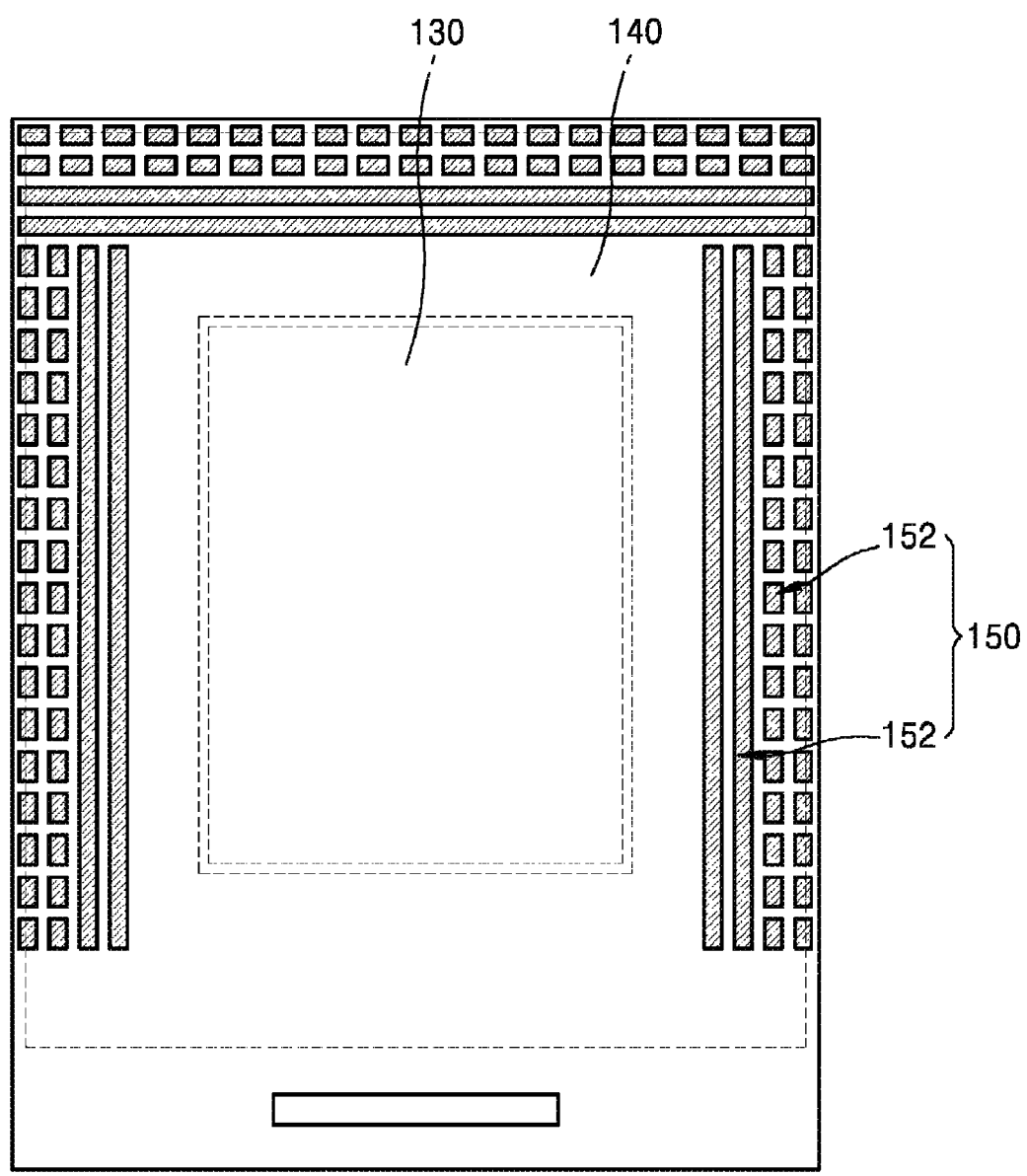
Figure 12C:
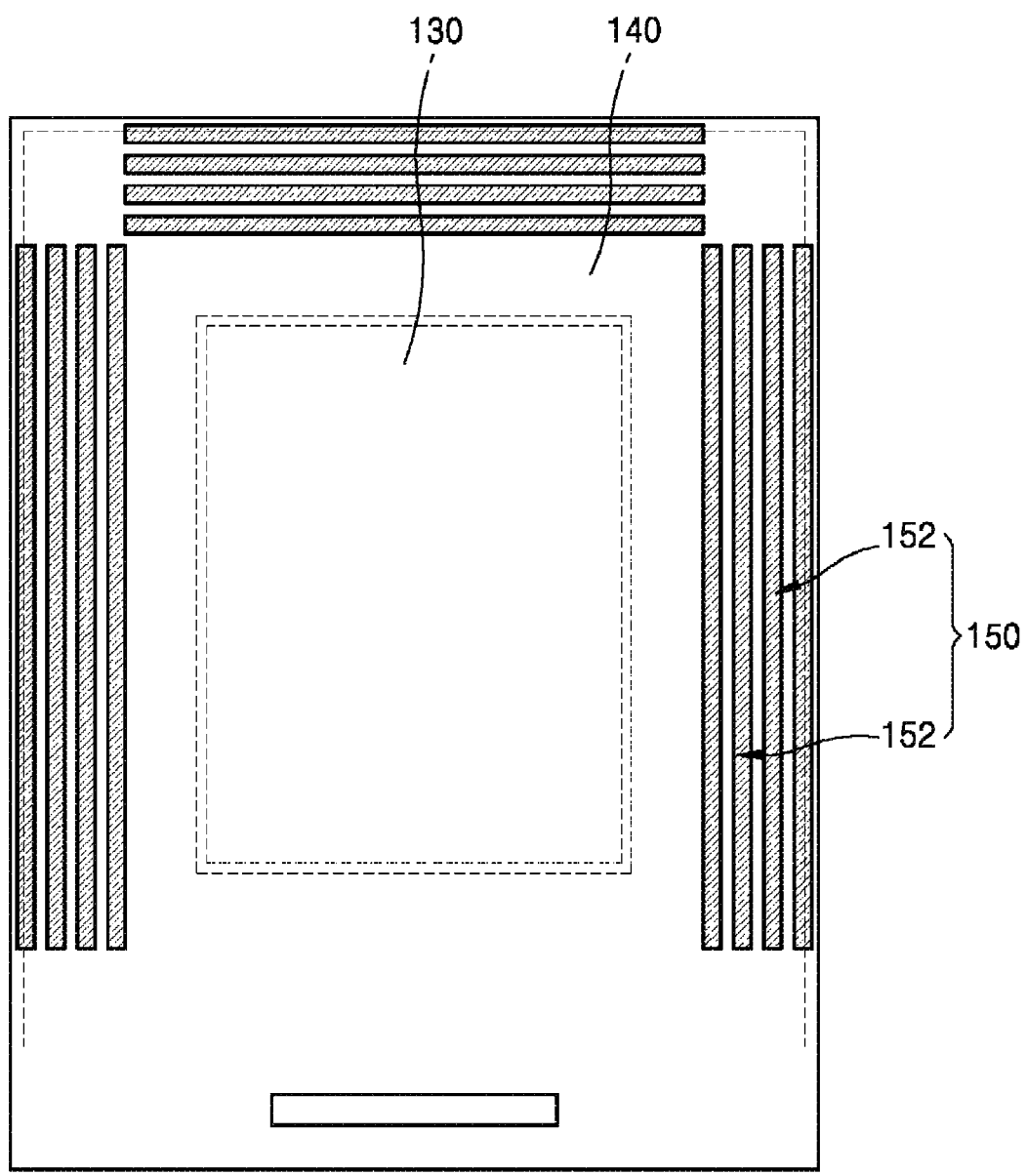
Figure 12D:
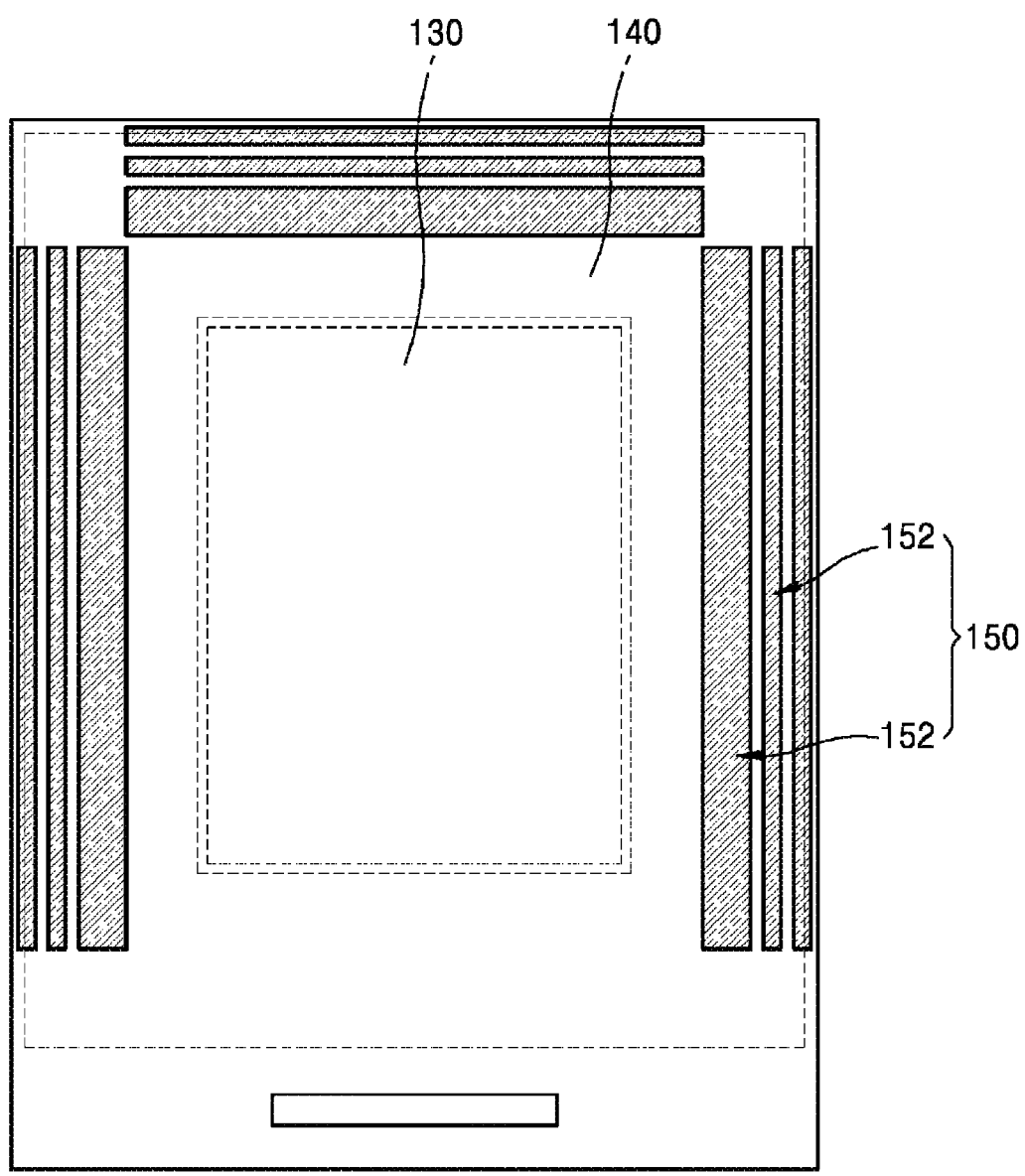
Figure 12E:
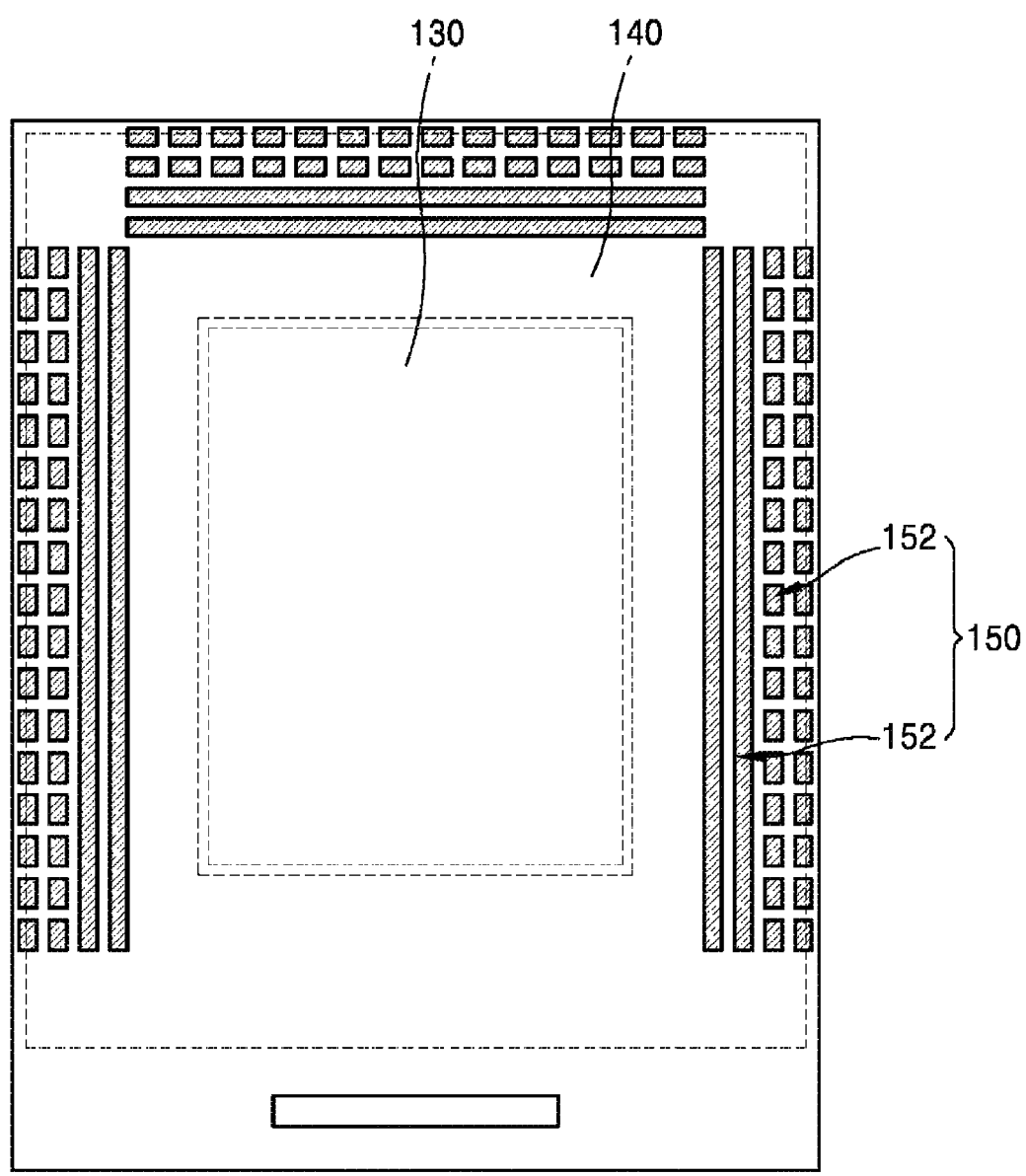
Figure 12F:
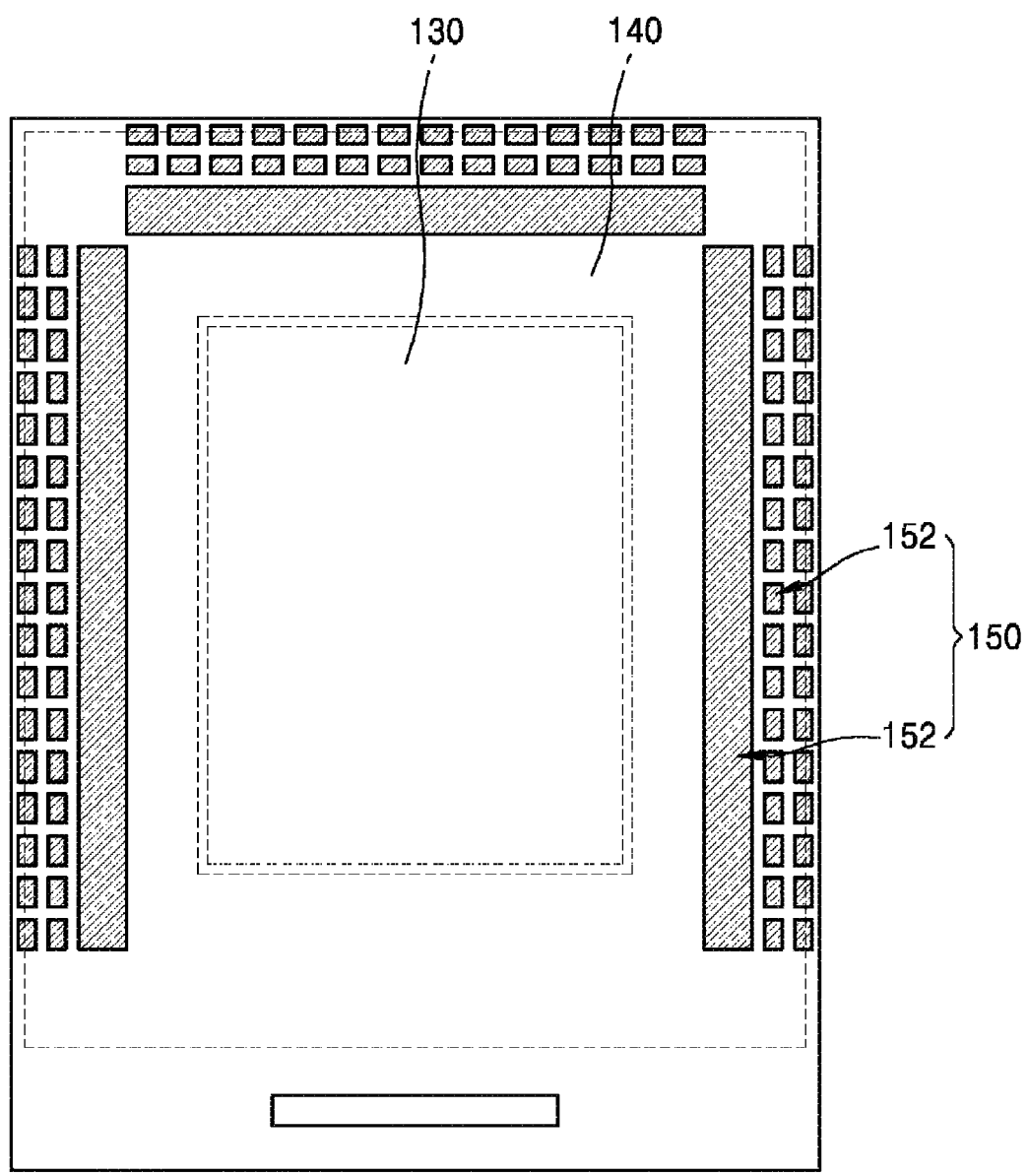

In another embodiment, as shown in FIG. 12B, the blocking unit 150 may include dot-like blocking patterns 152. In an embodiment, the blocking patterns 152 arranged at regions adjacent to the display 130 may have a linear shape, and the blocking patterns 152 arranged far from the display 130 may have a dot-like shape, or vice versa.

Figure 12G:
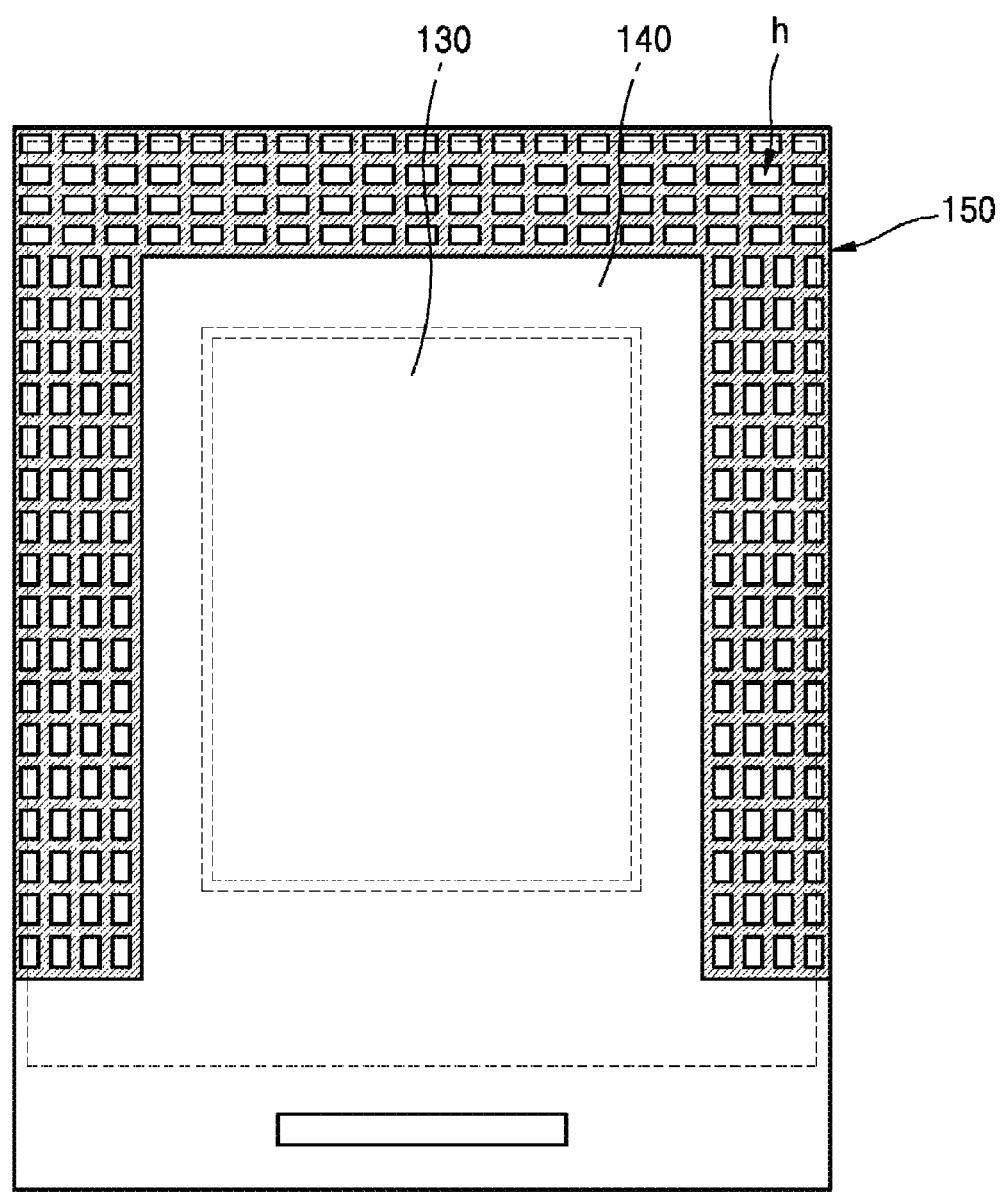

In further embodiments, as shown in FIGS. 12C through 12F, the blocking unit 150 may not be arranged at corners of the sealing element 140. In another embodiment, as shown in FIG. 12G, the blocking unit 150 may have a mesh-like shape including a plurality of openings "h."

Figure 13:
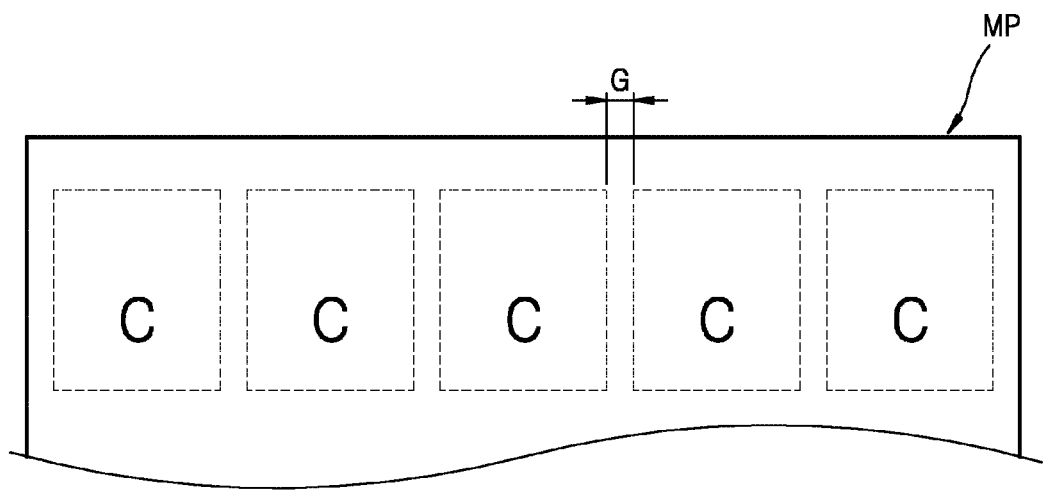
FIGS. 13 and 14 are a schematic plan diagram and a schematic sectional diagram, respectively, showing an operation of a method of manufacturing a display apparatus according to another embodiment.
Figure 14:
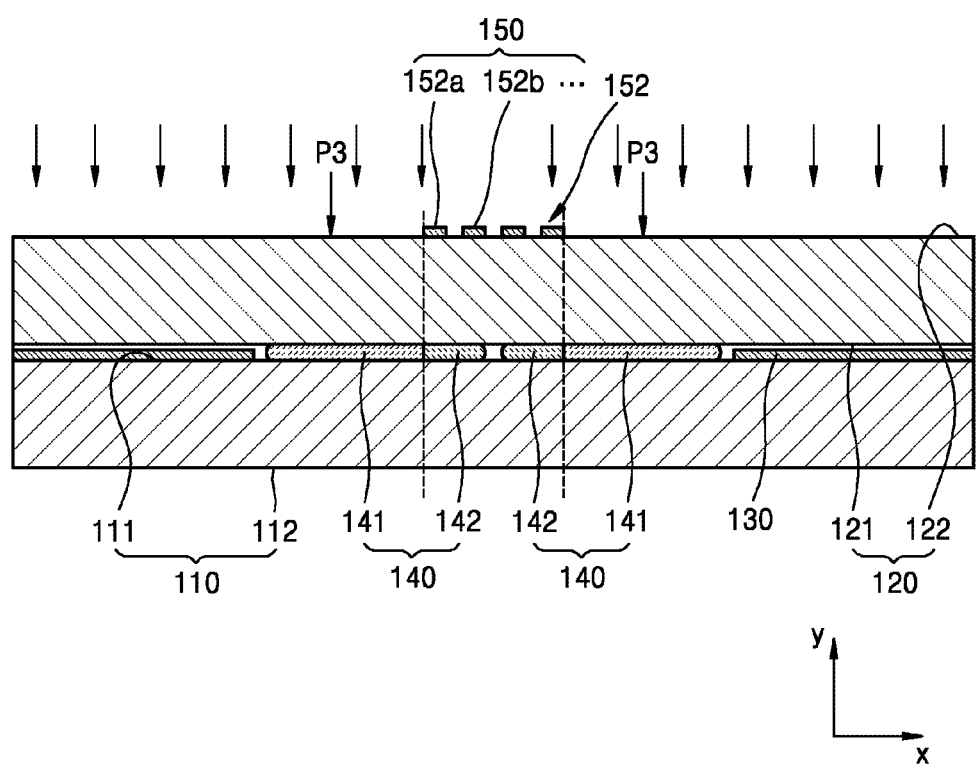

FIGS. 13 and 14 are a schematic plan diagram and a schematic sectional diagram showing an operation of a method of manufacturing a display apparatus according to another embodiment. Although cases of manufacturing a single display apparatus have been described above, the inventive concept is not limited thereto. For example, as shown in FIG. 13, a case of fabricating a plurality of display cells "C" concurrently (e.g., simultaneously) and manufacturing a plurality of display apparatuses is also within the scope of the inventive concept.

For example, a mother panel MP as shown in FIG. 13 may be formed by forming a plurality of displays apart from one another on the first substrate 110 and adhering the first substrate 110 to the second substrate 120 by using the sealing element 140. Here, the sealing element 140 may surround each of the plurality of displays. In FIG. 13, it may be understood that the dotted lines indicating the respective display cells "C" indicate an area for arranging the sealing element 140. Next, as shown in FIG. 14, a portion of the sealing element 140 may be exposed. FIG. 14 may be understood as a sectional diagram showing portions of two display cells "C" adjacent to each other among the plurality of display cells "C" of FIG. 13. Next, a plurality of display apparatuses having convex side surfaces may be manufactured by cutting portions of the first substrate 110 and the second substrate 120 at points of the first substrate 110 and the second substrate 120 corresponding to the exposed portion 141 of the sealing element 140 (e.g., the points indicated as P3 in FIG. 14) by using a cutting wheel.

In a method of manufacturing a display apparatus in the related art, after the entire sealing element 140 is exposed, the first substrate 110 and the second substrate 120 are cut at the center of portions of the first substrate 110 and the second substrate 120 between display cells "C" adjacent to each other, that is, the center of portions of the first substrate 110 and the second substrate 120 between the sealing element 140 of a first display cell "C" and the sealing element 140 of a second display cell "C" adjacent to the first display cell "C." Therefore, to secure cutting points, it is necessary to maintain a sufficient gap "G" between display cells "C," and, thus, a number of display cells "C" that may be simultaneously formed on the mother panel MP is limited.

However, in a method of manufacturing a display apparatus, according to the present embodiment, the first substrate 110 and the second substrate 120 are cut along the dotted lines indicating the sealing element 140 instead of cutting the first substrate 110 and the second substrate 120 along portions between display cells "C." Therefore, the gap "G" between display cells "C" may be further reduced as compared to the method in the related art, and thus a number of display cells "C" that may be concurrently (e.g., simultaneously) formed on the mother panel MP may be increased. As a result, cost and time for manufacturing display apparatuses may be significantly reduced.

Figure 15:
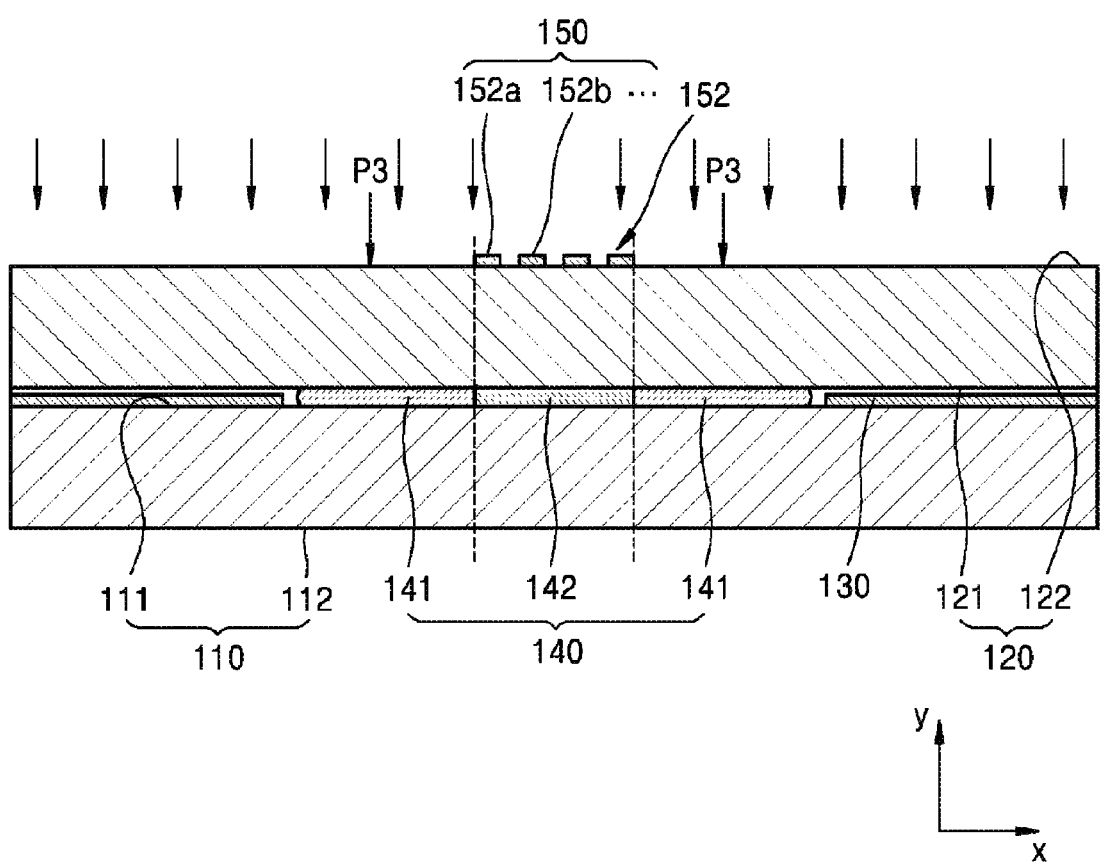
FIG. 15 is a schematic sectional diagram showing an operation of a method of manufacturing a display apparatus, according to another embodiment.

Although FIG. 14 shows that the display cells "C" adjacent to each other have independent sealing elements 140, the inventive concept is not limited thereto. For example, as shown in FIG. 15, which is a schematic sectional diagram showing an operation of a method of manufacturing a display apparatus, according to another embodiment, the display cells "C" adjacent to each other may share the sealing element 140. In this case, in case of exposing the sealing element 140 by using a photo mask including the phototransmissive plate 210 having formed thereat the blocking unit 150, only the exposed portion 141 of the sealing element 140 arranged close to the display 130 may be exposed. The exposure may be performed by arranging the blocking unit 150 in correspondence to the center of the sealing element 140. Next, at points of the first substrate 110 and the second substrate 120 corresponding to the exposed portion 141 of the sealing element 140 (e.g., the points indicated as P3 in FIG. 15), portions of the first substrate 110 and the second substrate 120 are cut by using a cutting wheel, and thus a plurality of display apparatuses having convex side surfaces may be manufactured. In another embodiment, as a modification of the methods of manufacturing a display apparatus described above with reference to FIGS. 13 and 14, a photo mask including the blocking unit 150 may be used.

According to the above-described embodiments of the inventive concept, a display apparatus with improved shock resistance and a method of manufacturing the same may be embodied. Furthermore, by manufacturing a display apparatus, according to an embodiment, degradation of equipment such as a laser source may be reduced. However, effects of the inventive concept are not limited thereto.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
    preparing a first substrate comprising a display thereon;
    adhering a second substrate to the first substrate by using a sealing element;
    exposing the sealing element by using a blocking member comprising a plurality of blocking patterns arranged apart from one another; and
    cutting the first substrate and the second substrate along portions thereof underneath the blocking member.

2. The method of claim 1, wherein the blocking member overlaps portions of the sealing element.

3. The method of claim 1, wherein the blocking member overlaps outer end portions of the sealing element.

4. The method of claim 1, wherein the adhering of the second substrate to the first substrate comprises:
    arranging the second substrate on the first substrate; and
    arranging the blocking member on the second substrate such that the blocking member overlaps a portion of the sealing element.

5. The method of claim 1, wherein the plurality of blocking patterns are sequentially arranged apart from one another in a widthwise direction of the sealing element.

6. The method of claim 1, wherein at least a portion of the blocking member comprises:
    a first blocking pattern at least partially overlapping the sealing element; and
    a second blocking pattern arranged apart from the first blocking pattern in a widthwise direction of the sealing element.

7. The method of claim 6, wherein a width of the first blocking pattern in the widthwise direction is equal to or greater than a width of the second blocking pattern in the widthwise direction.

8. The method of claim 1, wherein at least one of the plurality of blocking patterns has a linear shape or a dot-like shape.

9. The method of claim 1, wherein the plurality of blocking patterns comprises a metal.

10. The method of claim 1, further comprising forming a touch screen conductive pattern on the second substrate,
wherein the plurality of blocking patterns is formed during the forming of the touch screen conductive pattern.

11. The method of claim 1, wherein a distance between blocking patterns adjacent to each other among the plurality of blocking patterns is within about 7 μm.

12. The method of claim 1, wherein the blocking member overlaps three surface portions of the sealing element.

13. The method of claim 1,
wherein, in the exposing of the sealing element, a portion of the sealing element that does not overlap the blocking member is exposed, and
wherein a portion of the sealing element overlapping the blocking member is not exposed.

14. The method of claim 13, wherein the width of the exposed portion of the sealing element is less than or equal to 800 μm.

15. The method of claim 1, wherein, in the cutting of the first substrate and the second substrate, the first substrate and the second substrate are cut such that a width of the display apparatus measured with respect to the sealing element is greater than a width of the first substrate or the second substrate.

16. The method of claim 1, wherein, in the cutting of the first substrate and the second substrate, the first substrate is cut such that the width of the first substrate increases in a direction from an outer surface of the first substrate toward an inner surface of the first substrate.

17. The method of claim 1, wherein, in the cutting of the first substrate and the second substrate, the first substrate is cut such that a first constant portion having a constant width and a first increasing portion having an increasing width are defined.

18. The method of claim 17, wherein, in the cutting of the first substrate and the second substrate, the first constant portion is cut by using a cutting wheel.

19. The method of claim 17, wherein the first increasing portion is naturally cut due to internal stress of the first substrate.

20. A display apparatus manufactured according to the method of claim 1.

* * * * *